United States Patent
Wang et al.

(10) Patent No.: US 9,401,703 B1
(45) Date of Patent: Jul. 26, 2016

(54) VARIABLE FREQUENCY RELAXATION OSCILLATOR

(71) Applicant: FREESCALE SEMICONDUCTOR, INC., Austin, TX (US)

(72) Inventors: Zhengxiang Wang, Suzhou (CN); Chao Liang, Suzhou (CN); Jian Zhou, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/989,626

(22) Filed: Jan. 6, 2016

(30) Foreign Application Priority Data

Jul. 14, 2015 (CN) .......................... 2015 1 0506957

(51) Int. Cl.
| | |
|---|---|
| H03K 3/26 | (2006.01) |
| H03K 7/06 | (2006.01) |
| H03K 3/037 | (2006.01) |
| H03K 4/502 | (2006.01) |
| H03K 5/24 | (2006.01) |
| H03K 19/21 | (2006.01) |
| H03L 7/18 | (2006.01) |
| H03L 7/087 | (2006.01) |
| H03K 3/0231 | (2006.01) |
| H03K 3/08 | (2006.01) |

(52) U.S. Cl.
CPC ................ *H03K 7/06* (2013.01); *H03K 3/0231* (2013.01); *H03K 3/037* (2013.01); *H03K 3/08* (2013.01); *H03K 4/502* (2013.01); *H03K 5/24* (2013.01); *H03K 19/21* (2013.01); *H03L 7/087* (2013.01); *H03L 7/18* (2013.01)

(58) Field of Classification Search
CPC ........ H03K 3/0231; H03K 3/08; H03L 7/087; H03L 7/18
USPC ...................... 331/111, 143, 11, 16
See application file for complete search history.

(56) References Cited

U.S. PATENT DOCUMENTS

| | | | |
|---|---|---|---|
| 7,800,454 B2 * | 9/2010 | Vanselow | ............... H03K 3/011 331/1 R |
| 8,319,524 B1 | 11/2012 | Cheng | |
| 8,350,631 B1 | 1/2013 | Wadhwa | |
| 8,643,443 B1 | 2/2014 | Wang | |
| 8,773,210 B2 | 7/2014 | Sinha | |
| 8,803,619 B1 | 8/2014 | Sinha | |
| 9,214,927 B2 | 12/2015 | Wang | |
| 2012/0126906 A1 | 5/2012 | Choe | |

* cited by examiner

*Primary Examiner* — Arnold Kinkead
(74) *Attorney, Agent, or Firm* — Charles E. Bergere

(57) ABSTRACT

A relaxation oscillator system has a relaxation oscillator and a frequency control (FC) unit. The oscillator includes first and second oscillator sub-circuits and a latch. The first and second oscillator sub-circuits receive from the FC unit, respectively, first and second control signals for controlling corresponding outputs provided to the latch by the first and second oscillator sub-circuits. The latch outputs a variable frequency feedback signal provided to the FC unit. The FC unit receives a frequency control signal for controlling the frequency of an oscillator output signal and generates the first and second control inputs based on the frequency control signal and the feedback signal so that changes to the oscillator frequency are implemented by each oscillator sub-circuit while that sub-circuit is in an idle state to avoid glitches in the oscillator output signal.

16 Claims, 5 Drawing Sheets

VARIABLE FREQUENCY RELAXATION OSCILLATOR

BACKGROUND OF THE INVENTION

The present invention relates to integrated circuits (IC) and, more particularly, to a variable frequency relaxation oscillator.

FIG. 1 is a simplified schematic circuit diagram of a conventional relaxation oscillator 100. The oscillator 100 receives a frequency control signal 100*i*, which determines an output oscillation frequency, and outputs an oscillation signal 100*o*, whose frequency depends on the received frequency control signal 100*i* and which may be used as a clock signal. The oscillator 100 has a set/reset (SR) latch 101 and two oscillator sub-circuits 102. The SR latch 101 has a set (S) input, a reset (R) input, a Q output, and a complementary QB output.

Each oscillator sub-circuit 102 receives (i) the frequency control signal 100*i*, (ii) a drain supply voltage VDD, (iii) a source supply voltage VSS, and (iv) a reference voltage VREF. The oscillator 100 uses the two substantially identical oscillator sub-circuits 102, rather than just a single oscillator sub-circuit, since the symmetry of the two sub-circuits 102 may make it easier to match the characteristics of the high and low segments of the resultant oscillator output signal 100*o*.

Each oscillator sub-circuit 102 outputs a respective output signal 102*o*, where the output signal 102*o*(1) of the sub-circuit 102(1) is applied to the R input of the SR latch 101 and the output signal 102*o*(2) of the sub-circuit 102(2) is applied to the S input of the SR latch 101. The SR latch 101 operates such that if the S input signal 102*o*(2) is high and the R input signal 102*o*(1) is low, then the Q output 100*o* is high and the QB output 101*a* is low, and if the R input signal 102*o*(1) is high and the S input signal 102*o*(2) is low, then the Q output 100*o* is low and the QB output 101*a* is high.

Each oscillator sub-circuit 102 comprises a current source 103, a n-channel field-effect transistor (FET) 104 having drain, source, and gate terminals, a variable capacitor 105 having first and second terminals and a control input, and a comparator 106 having positive and negative inputs and an output.

The current source 103 receives the drain supply voltage VDD and outputs a current to a node 107, which is connected to (i) the drain terminal of the FET 104, (ii) the first terminal of the variable capacitor 105, and (iii) the positive input of the comparator 106. The source supply voltage VSS is connected to the source of the FET 104 and the second terminal of the capacitor 105. The negative input of the comparator 106 is connected to the reference voltage VREF. The capacitance of the variable capacitor 105 is controlled by the input signal 100*i*, which is connected to the control input of the variable capacitor 105. The gate terminal of each FET 104 is connected to a corresponding output of the SR latch 101, where the gate of the FET 104(1) is controlled by the QB output 101*a* and the gate of the FET 104(2) is controlled by the Q output 100*o*.

FIG. 2 is a timing diagram for some of the signals of the oscillator 100 of FIG. 1, namely the frequency control signal 100*i*, the voltages at the two nodes 107(1) and 107(2), and the output signal 100*o*. At time $t_0$, the Q output 100*o* is high and the QB output 101*a* is low. As a result, FET 104(2), which is controlled by the Q output signal 100*o*, is ON, and FET 104(1), which is controlled by the QB output signal 101*a*, is OFF. Accordingly, the voltage $V_{107(2)}$ at the node 107(2) is held at or near to the source supply voltage VSS, which is zero volts, via the turned-on FET 104(2). Since the capacitor 105 (2) is not charging, the sub-circuit 102(2) may be considered to be in an idle state at this time. Meanwhile, the voltage $V_{107(1)}$ at the node 107(1) rises steadily as current is provided to the first terminal of the capacitor 105(1) by the current source 103(1).

The reference voltage VREF in FIG. 2 is approximately 0.4 volts. At time $t_1$, when the voltage $V_{107(1)}$ increases above the reference voltage VREF, and the output 102*o*(1) of the comparator 106(1)—provided to the R input of the SR latch 101—goes from low to high. Note that the output 102*o*(2) of the comparator 106(2), which is provided to the S input of the SR latch 101, remains low because the voltage $V_{107(2)}$ remains below the reference voltage VREF at time $t_1$. As a result of the switch in the output 102*o*(1) of the comparator 106(1) at time $t_1$, the Q output 100*o* goes from high to low and, correspondingly, the QB output 101*a* goes from low to high. Since the FET 104(1) is turned on when the QB output 101*a* goes from low to high, the capacitor 105(1) is discharged, and the voltage $V_{107(1)}$ at the node 107(1) drops down substantially to the source supply voltage VSS. Since, as a result, the voltage $V_{107(1)}$ returns to being less than the reference voltage VREF, the output 102*o*(1) of the comparator 106(1) correspondingly returns to low.

Between time $t_1$ and time $t_2$, the FET 104(2) is off, and the FET 104(1) is on. Consequently, similar to the above-described operation, the voltage $V_{107(2)}$ at the node 107(2) rises steadily while the voltage $V_{107(1)}$ at the node 107(1) is held at or near the source supply voltage VSS. During this time, the sub-circuit 102(1) may be considered to be in an idle state. Then, at time $t_2$, similar to the above-described operation, the voltage $V_{107(2)}$ exceeds the reference voltage VREF and, as a result, the output 102*o*(2) of the comparator 106(2)—provided to the S input of the SR latch 101—goes from low to high. As a result, the Q output 100*o* of the SR latch 101 goes from low to high, the QB output 101*a* goes from high to low, the FET 104(2) is turned on, the capacitor 105(2) is discharged, the FET 104(1) is turned off, and the above-described cycle then repeats.

At time $t_3$, the frequency control signal 100*i* changes to set a new, higher value for the capacitance of the variable capacitors 105. Because the charging rates of the variable capacitors 105 depends on their respective capacitance, increasing the capacitance value of the variable capacitors 105 lengthens the cycle period and, correspondingly, lowers the cycle frequency of the output signal 100*o*. Because the capacitance of the variable capacitors 105 is changed mid-operation, a glitch occurs between time $t_3$ and time $t_4$, where the voltage $V_{107(1)}$ briefly spikes over the reference voltage VREF, and the period of the output signal 100*o* is clipped before normal operation—now at the new, lower frequency—is resumed at time $t_4$.

As used herein, a glitch refers to a half-cycle-positive or negative—of an oscillator output whose period is shorter than the preceding and following corresponding half-cycles. The glitch may also be characterized by an irregular shape and/or a voltage level different from the preceding and following corresponding half-cycles. Between time $t_4$ and time $t_5$, the oscillator 100 operates as described above for time $t_1$ and time $t_2$, but with the new capacitance value for the variable capacitors 105. At time $t_5$, the oscillator 100 operates as described above for time $t_2$. Between time $t_5$ and time $t_6$, the oscillator 100 operates as described above for time $t_0$. After time $t_6$, the cycle of time $t_4$ to time $t_6$ repeats.

The glitch between time $t_3$ and time $t_4$ may adversely affect the operation of components relying on the output signal 100*o*. Accordingly, it would be advantageous to have a glitch free relaxation oscillator

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

Figure 1:
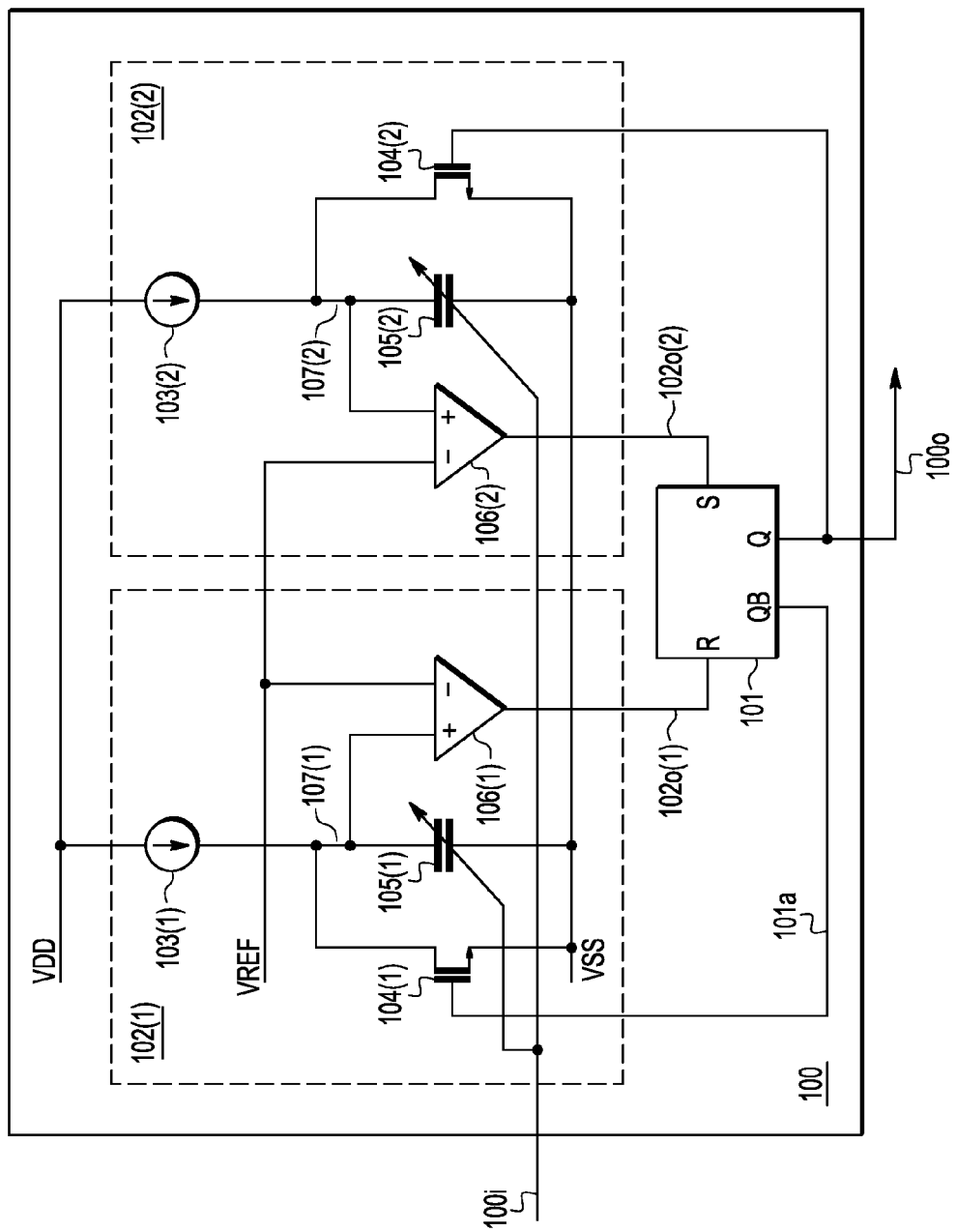
FIG. 1 is a simplified schematic circuit diagram of a conventional relaxation oscillator.
Figure 3:
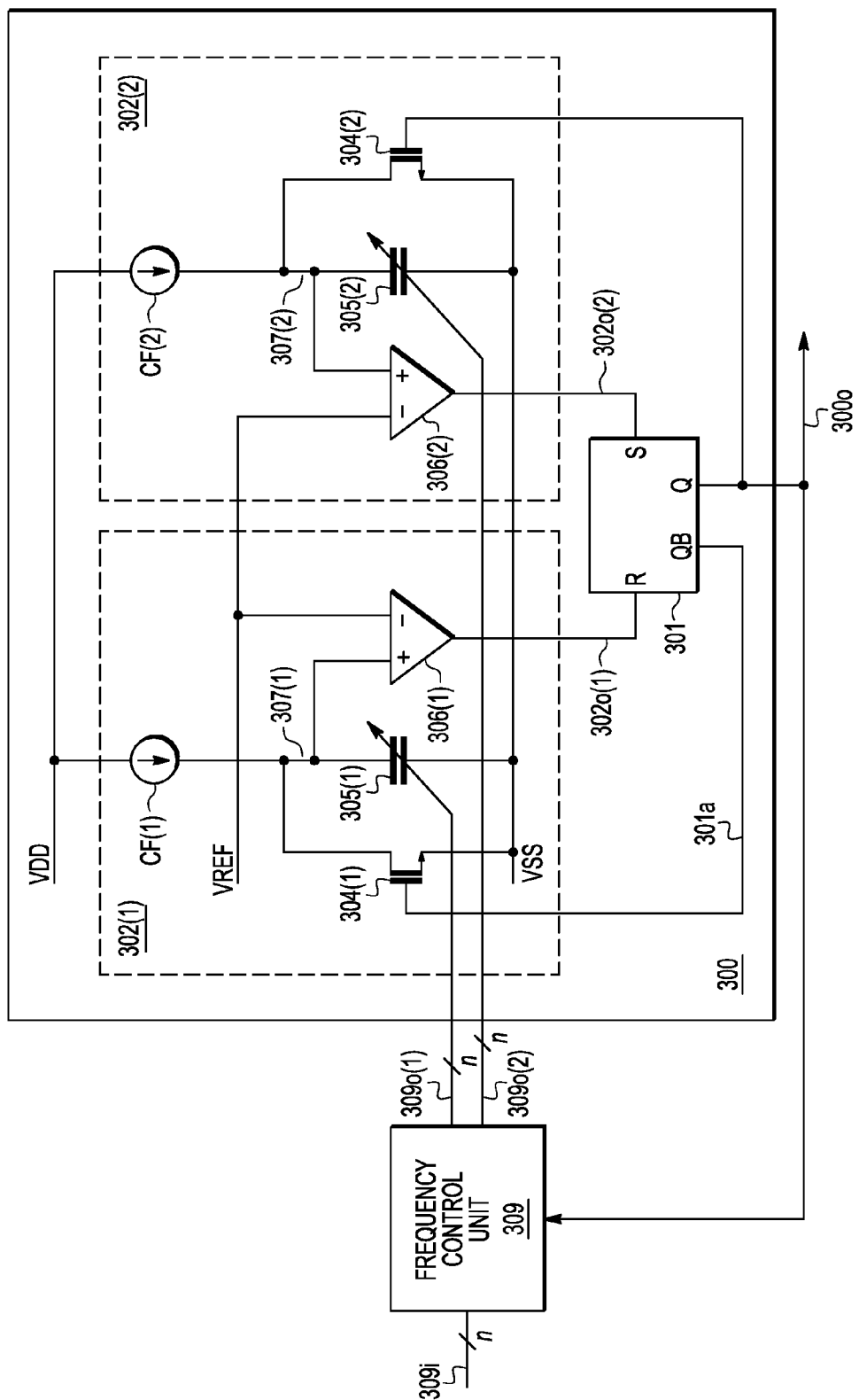
FIG. 3 is a simplified schematic circuit diagram of a relaxation oscillator in accordance with one embodiment of the present invention.

Referring to FIG. 3, a simplified schematic circuit diagram of a relaxation oscillator system 308 in accordance with one embodiment of the invention. The oscillator system 308 (i) receives an n-bit frequency control signal 309i, which determines an output oscillation frequency for the oscillator system 308 and (ii) outputs an oscillation signal 300o, whose frequency depends on the frequency control signal 309i and which may be used as a clock signal by other components (not shown). The oscillator system 308 comprises a frequency control (FC) unit 309 and an oscillator 300. The FC unit 309 receives the inputs 309i and 300o and outputs two n-bit control signals 309o(1) and 309o(2). The oscillator 300 substantially resembles the oscillator 100 of FIG. 1, and elements of the oscillator 300 that correspond to similar elements of the oscillator 100 are similarly labeled, but with a different prefix.

Unlike the oscillator 100, where the capacitances of the variable capacitors 105 are controlled by a single frequency control signal 100i, the variable capacitors 305 of the oscillator 300 are independently controlled and have respective corresponding input control signals. Namely, (i) the capacitance of the variable capacitor 305(1) is determined by the control signal 309o(1) received from the FC unit 309 and (ii) the capacitance of the variable capacitor 305(2) is determined by the control signal 309o(2) received from the FC unit 309. The FC unit 309 uses the output signal 300o to determine the timing for propagating new values of the control signals 309o. Specifically, new values are transmitted via each control signal 309o when the corresponding oscillator sub-circuit 302 is in an idle state to avoid causing a glitch as described above in reference to the conventional oscillator 100 of FIG. 1.

In one possible implementation, each variable capacitor 305 is a digitally tunable, switched capacitor bank comprising a plurality of component capacitors (not shown), where the control signal 309o represents a binary number that determines how many, which ones, or what percentage of the component capacitors are activated and connected to the corresponding current source CF and the source supply voltage VSS. As will be appreciated by a person of ordinary skill in the art, there are many ways of encoding values on the control signal 309o to have a desired resultant capacitance of the corresponding variable capacitor 305. For example, if the variable capacitor 305 has a maximum capacitance of $C_{MAX}$, and the control signal 309o is a 2-bit signal, then 00, 01, 10, and 11 on the control signal 309o may represent, respectively, 25%, 50%, 75%, and 100% of $C_{MAX}$.

In response to receiving a new or changed value via the frequency control signal 309i, the FC unit 309 determines an idle period for each oscillator sub-circuit 302 based on the output signal 300o and then updates the capacitance of each variable capacitor 305 during a corresponding idle period so as to prevent an output glitch as happens with oscillator 100. After the capacitance value of one of the variable capacitors 305 is updated, the capacitance value of the other variable capacitor is preferably updated in the immediately subsequent half-cycle of the output 300o so as to provide a regular square wave at the new frequency on the output signal 300o.

Figure 2:
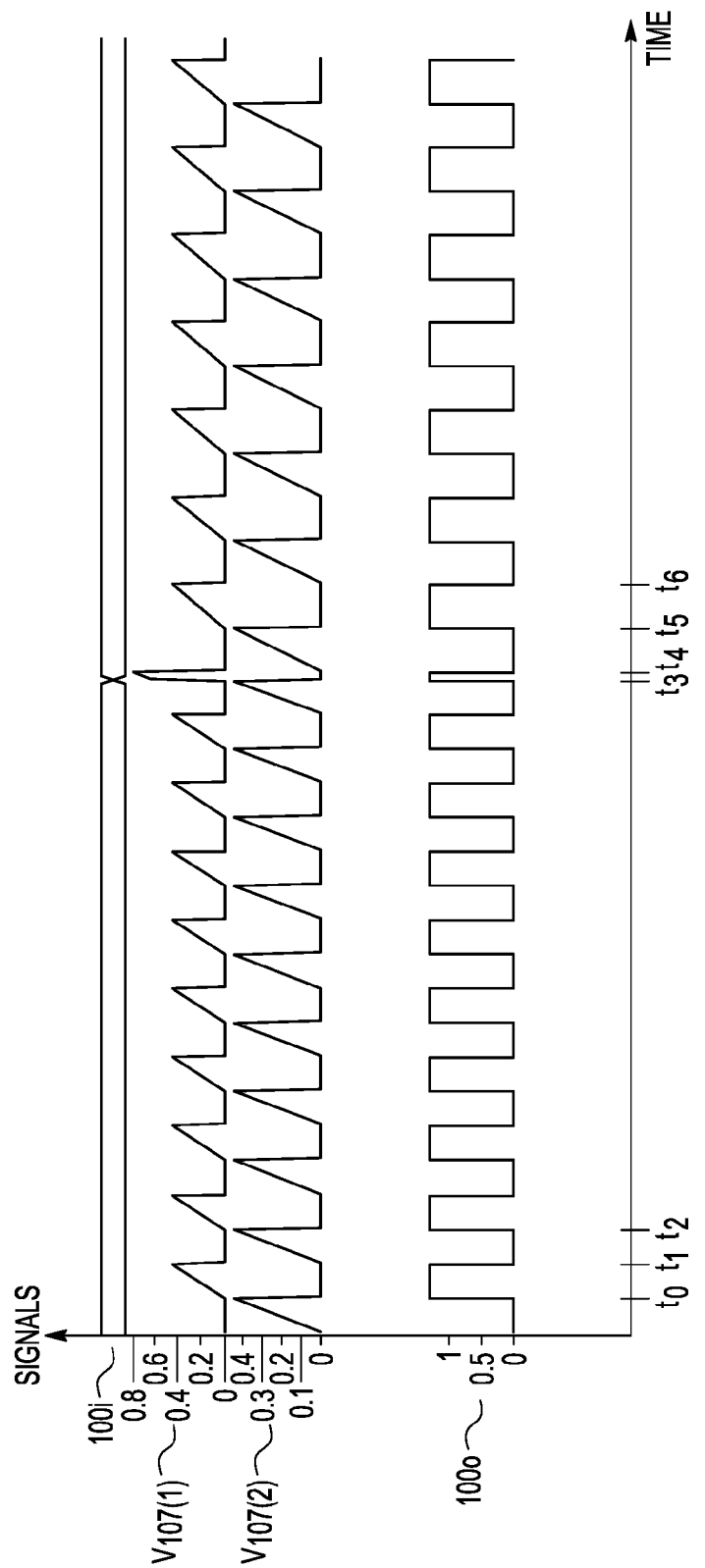
FIG. 2 is a timing diagram for some of the signals of the oscillator of FIG. 1.
Figure 4:
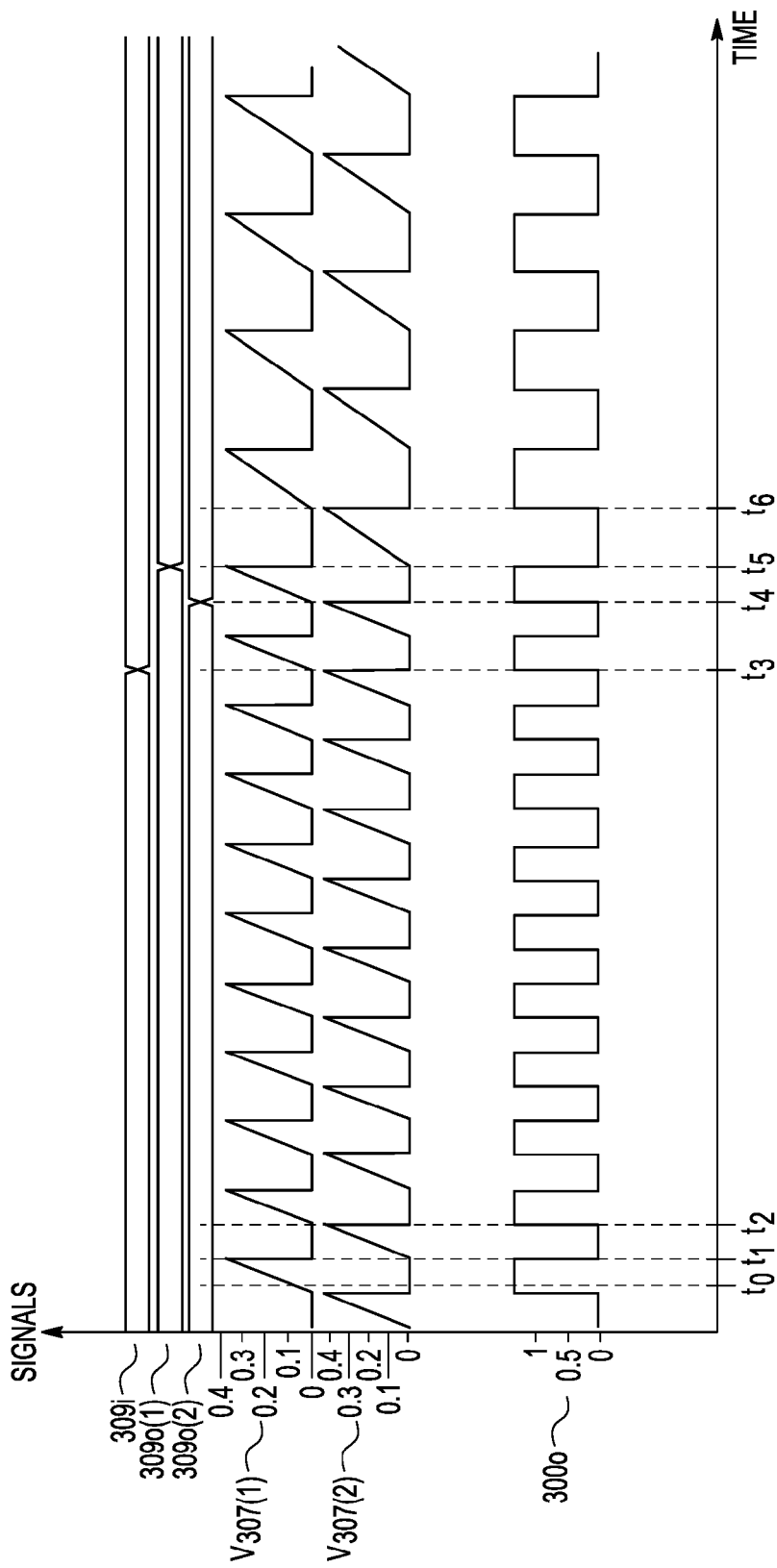
FIG. 4 is an exemplary timing diagram for some of the signals of the oscillator of FIG. 3.

FIG. 4 is an exemplary timing diagram for some of the signals of the oscillator system 308 of FIG. 3, namely the frequency control signal 309i, the two control signals 309o, the voltages at the two nodes 307, and the output signal 300o. From time to $t_0$ time $t_3$, including at times $t_1$ and $t_2$, the Q output 300o, the QB output 301a, the voltage $V_{307(2)}$ at the node 307(2), and the voltage $V_{307(1)}$ at the node 307(1) behave substantially the same as described above for their corresponding signals in FIG. 2—respectively, the Q output 100o, the QB output 101a, the voltage $V_{102(2)}$, and the voltage $V_{107(1)}$. Note that, in addition, the exemplary reference voltage VREF (not shown in FIG. 4) is approximately 0.4 volts, as in FIG. 2.

Then, at time $t_3$, the frequency control signal 309i changes to set a new, higher value for the capacitance of the variable capacitors 305, which—as explained above—will result in a lengthening of the cycle period—and a corresponding lowering of the cycle frequency—of the output signal 300o. At time $t_4$, which coincides with the next uptick of the output signal 300o, the control signal 309o(2) propagates the new, higher capacitance value to the variable capacitor 305(2), which has just gotten discharged at time $t_4$ and will, consequently, be idle for the subsequent half-cycle of the output signal 300o until time $t_5$.

At time $t_5$, which coincides with the next downtick of the output signal 300o, the control signal 309o(1) propagates the new, higher capacitance value to the variable capacitor 305(1), which has just gotten discharged at time $t_5$ and will, consequently, be idle for the subsequent half-cycle of the output signal 300o until time $t_6$. Between time $t_5$ and time $t_6$, the FET 304(2) is off and, consequently, the voltage $V_{307(2)}$ rises steadily as the variable capacitor 305(2)—now at its new, higher capacitance value—is charged by the corresponding current source CF(2).

At time $t_6$, the voltage $V_{307(2)}$ exceeds the reference voltage VREF, which, similar to the process described above—but involving the comparator 306(2), the FETs 304, and the SR latch 301—causes the variable capacitor 305(2) to discharge and the variable capacitor 305(1)—now, also at its new, higher capacitance value—to start steadily charging. After time $t_6$, the output signal 300o continues to oscillate at the new, lower frequency.

The FC unit 309 can control its outputs 309o depending on which variable capacitor 305 is idle at any particular time. The determination of which sub-circuit is idle may be based on an instant value of Q output signal 300o and/or the upticks and downticks of the Q output signal 300o. Specifically, (i) if the output signal 300o is high, following an uptick, then the variable capacitor 305(2) is idle and (ii) if the output signal 300o is low, following a downtick, then the variable capacitor 305(1) is idle.

The FC unit 309 delays propagation of a new value on the control input 309i to the control signals 309o(1) and/or 309o(2) so that the capacitance value for a variable capacitor 305 is not changed while that variable capacitor 305 is charging. Rather, the propagation of a new value via each control output 309o is timed so that the capacitance value for the variable capacitor 305 is changed while the variable capacitor 305 is idle. In one implementation, the FC unit 309 may utilize edge-triggered flip-flops to ensure the above-described controlled propagation of new values via the control output signals 309o.

Figure 5:
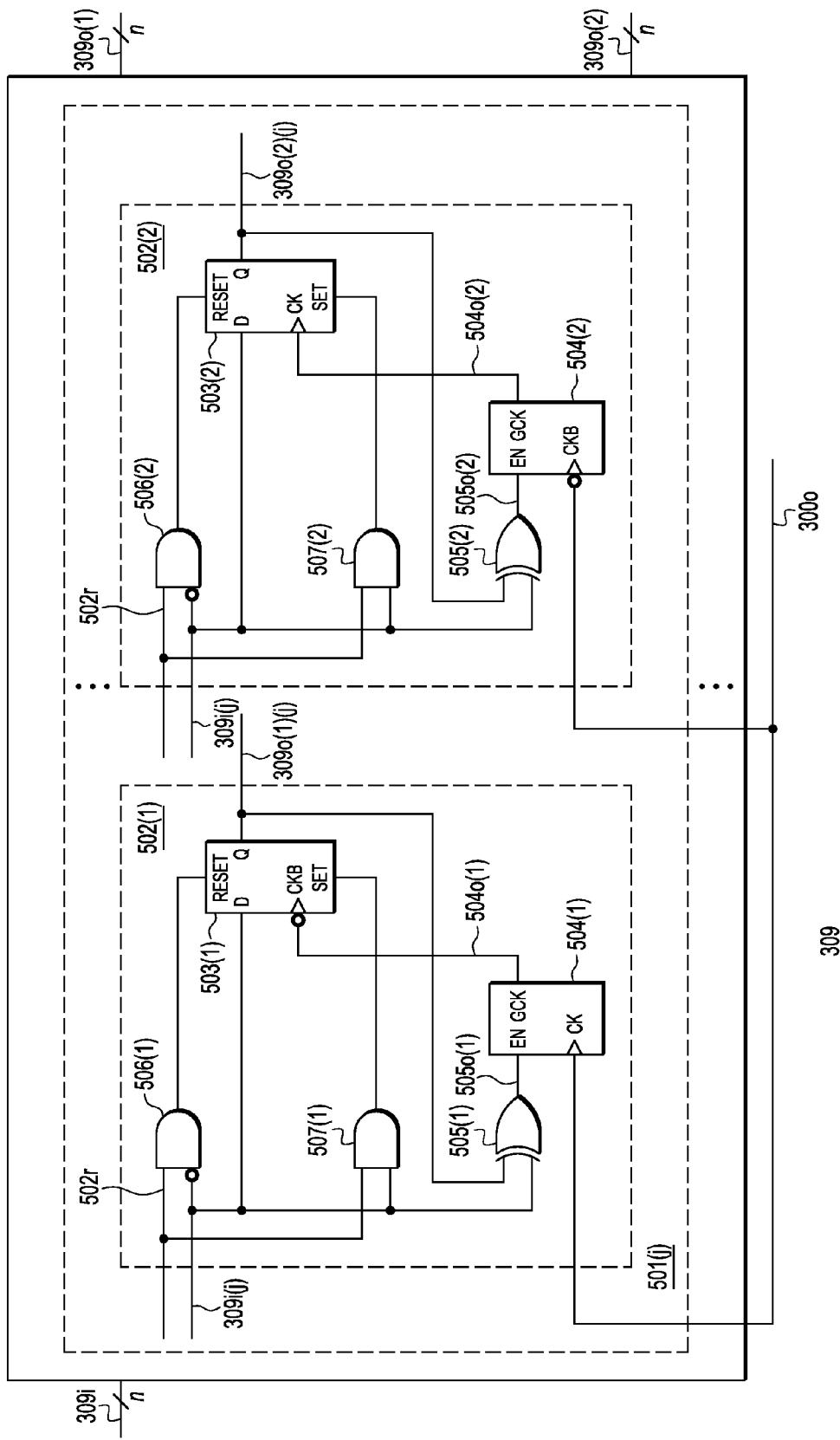
FIG. 5 is a simplified schematic diagram of an exemplary implementation of the FC unit of FIG. 3.

FIG. 5 is a simplified schematic diagram of an exemplary implementation of the FC unit 309. The FC unit 309 comprises n data-processing sub-circuits 501, each one for processing a corresponding bit of the n-bit frequency control signal 309i. Specifically, each of the nsub-circuits 501 processes a corresponding bit 309i(j) of the frequency control signal 309i, where j is an integer from 1 to n. The sub-circuit 501 comprises two propagation circuits 502. Each propagation circuit 502 comprises a D flip-flop 503, a clock-gating cell 504, an XOR gate 505, and two AND gates 506 and 507.

The D flip-flop 503 has (i) D, clock, set, and reset inputs and (ii) a Q output. The D input of the D flip-flop 503 receives the data bit 309i(j). Note that the D flip-flop 503(1) has a negative-edge-triggered clock input, while the D flip-flop 503(2) has a positive-edge-triggered clock input. When triggered via its clock input, the D flip-flop 503 propagates the data bit 309i(j) via its Q output, otherwise maintaining the previous Q output.

The clock-gating cell 504 has enable and clock inputs and a gated-clock output. Note that the clock input of the clock-gating cell 504(1) is positive-edge triggered, while the clock input of the clock-gating cell 504(2) is negative-edge triggered. The gated-clock output 504o of the clock-gating cell 504 is provided to the clock input of the corresponding D flip-flop 503. The clock-gating cell 504 functions to (i) pass through, via its gated-clock output 504o, the received clock input 300o when the enable input is high and (ii) provide a steady output, via its gated-clock output 504o, when the enable input is low. Note that the clock-gating cell 504(1) provides a steady low output when the corresponding enable input is low, while the clock-gating cell 504(2) provides a steady high output when the corresponding enable input is low.

The XOR gate 505 functions as a comparator to determine whether the value of the data bit 309i(j) has changed. Specifically, the XOR gate 505 compares (i) the data bit 309i(j) to (ii) the Q output of the D flip-flop 503, and outputs a 1 (high) if the two are different or a 0 (low) if the two are same. The output 505o of the XOR gate 505 is provided to the enable input of the clock-gating cell 504. Consequently, the clock-gating cell 504 goes into (i) a pass-through state if the data bit 309i(j) and the Q output of the D flip-flop 503 are different and (ii) a clock-blocking state if they are the same. The clock-blocking state is useful for limiting the energy used by the D flip-flop 503 since the D flip-flop 503 uses less energy if its clock input is not triggered.

The D flip-flop 503, the XOR gate 505, and the clock-gating cell 504 work together so that (i) while the data bit 309i(j) remains unchanged—in other words, while the data bit 309i(j) is the same as the Q output of the D flip-flop 503—the clock-gating cell 504 prevents the clock signal 300o from getting to the clock input of the D flip-flop 503, and the D flip-flop 503 is in a power-saving mode since its clock input is not triggered and (ii) if the data bit 309i(j) changes—in other words, if the data bit 309i(j) is different from the Q output of the D flip-flop 503—then the clock-gating cell 504 propagates the clock signal 300o to the clock input of the D flip-flop 503, which then causes an update of the Q output of the D flip-flop 503 to the new value of the data bit 309i(j). The updating of the Q output of the D flip-flop 503, in turn, causes the output of the XOR gate 505—which is also the enable input of the clock-gating cell 504—to return to low and, consequently, gets the clock-gating cell 504 to again block the propagation of the clock signal 300o to the clock input of the D flip-flop 503. This causes the D flip-flop 503 to return to the power-saving mode.

Because of the different edge-triggering setups used in the respective propagation circuits 502(1) and 502(2), as described above, the new value of the control input 309i is propagated at a first time via the control output 309o(1) and at a second, different time via the control output 309o(2), as can be seen in FIG. 4.

The AND gates 506 and 507 are used to control the set and reset inputs of the corresponding D flip-flop 503 and to control the propagation of the chip reset signal 502r, which is used, for example, when powering on the integrated circuit device (not shown) that incorporates the oscillator system 308. Note that alternative embodiments may dispense with the AND gates 506 and 507.

Embodiments of the invention have been described where the variable capacitors are capacitor banks whose capacitance is controlled by varying the number of connected and/or active capacitors in the capacitor bank. The invention, however, is not so limited. In some alternative embodiments, different types of digitally tunable capacitors are used such as, for example, digitally tunable varactors. In some alternative embodiments, the variable capacitors may be tunable by an analog signal. As would be appreciated by a person of ordinary skill in the art, alternative embodiments would have corresponding modifications to the type of control signal to set the capacitance of the alternative variable capacitors.

Embodiments of the invention have been described where the frequency of the relaxation oscillator is controlled by controlling the capacitance of variable-capacitor components of the relaxation oscillator—namely, the FC unit receives a single frequency control signal and outputs two corresponding capacitance control signals to the two oscillator sub-circuits. The invention is not, however, so limited. In alternative embodiments of the invention, the frequency of the relaxation oscillator is controlled by controlling a property other than the capacitance of variable-capacitor components of the relaxation oscillator. Note that, in these alternative embodiments, fixed capacitors may be used in place of the above-described variable capacitors.

For example, in some alternative embodiments, the frequency is controlled by varying the value of the reference voltage, where the FC unit receives a single frequency control signal and outputs two corresponding reference-voltage control signals to the two oscillator sub-circuits. Note that raising the reference voltage lengthens the period and lowers the frequency of the oscillator output. In some other alternative embodiments, the frequency is controlled by varying the current provided to the capacitor by the current source, where the FC unit receives a single frequency control signal and outputs two corresponding current-source-current control signals to the two oscillator sub-circuits. Note that increasing the current shortens the period and increases the frequency of the oscillator output.

Embodiments of the invention have been described where the FC unit essentially splits and delays the frequency control signal received by the FC unit and provides output control signals to corresponding variable capacitors. The invention, however, is not so limited. In alternative embodiments, the FC unit may further alter the received frequency control signal for provision to the variable capacitors. For example, the FC unit may (i) receive a serial frequency control signal and provide a parallel control signal, or vice-versa, (ii) receive a frequency control signal at one resolution and provide an output control signal at a different resolution so as to increase or decrease the number of bits in the signal, (iii) convert the control signal from analog to digital or vice-versa, or (iv) receive a frequency control signal of one type—e.g., varying capacitance, voltage, current, frequency, or period—and provide output control signals of a different type.

Embodiments of the invention have been described where the FC unit delays propagation of a new received input control value to both oscillator sub-circuits. The invention is not, however, so limited. In an alternative embodiment, the FC unit immediately propagates the new frequency-control value to the oscillator sub-circuit that is idle when the new value is received by the FC unit and then propagates the new value to the other oscillator sub-circuit when the other oscillator sub-circuit becomes idle.

Embodiments of the invention have been described where each FC unit comprises a clock-gating cell. Note, however, that the clock-gating cell is optional and that alternative embodiments may dispense with the clock-gating cell.

Embodiments of the invention have been described using an SR latch. The invention is not, however, so limited. In alternative embodiments of the invention, a different type of latch is used in the oscillator circuit. Note that, as used herein, the term latch refers generally to a bi-stable digital circuit adapted to receive at least two inputs and provide at least one output.

An embodiment of the invention has been described where the FC unit receives the Q output from the latch of the oscillator for determining the idle/not-idle state of the oscillator sub-circuits. The invention is not, however, so limited. In alternative embodiments, an FC unit that employs different logic receives the complementary QB output from the latch of the oscillator for determining the idle/not-idle state of the oscillator sub-circuits. Note that either the Q output or the complementary QB output may be used as a feedback signal provided to the FC unit. Also note that either the Q output or the complementary QB output may be used as a clock signal output of the oscillator system.

Embodiments of the invention have been described using particular logic components. The invention is not, however, limited to the particular logic components described. Alternative embodiments may use alternative logic components as well as additional components such as, for example, inverters to invert various signals while still achieving the same function.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A relaxation oscillator system for generating an oscillating output signal based on a frequency control (FC) signal, the system comprising:
   a relaxation oscillator configured to generate the oscillating output signal; and
   a frequency control (FC) unit that controls the frequency of the oscillating output signal generated by the relaxation oscillator, wherein:
      the FC unit generates at least first and second control signals for provision to the relaxation oscillator;
      the first and second control signals are generated based on the FC signal and a feedback signal from the relaxation oscillator;
      the first control signal is different from the second control signal; and
      the frequency of the oscillating output signal is controlled based on the first and second control signals, and
   wherein the oscillating output signal is a complement of the feedback signal.

2. A relaxation oscillator system for generating an oscillating output signal based on a frequency control (FC) signal, the system comprising:
   a relaxation oscillator configured to generate the oscillating output signal; and
   a frequency control (FC) unit that controls the frequency of the oscillating output signal generated by the relaxation oscillator, wherein:
      the FC unit generates at least first and second control signals for provision to the relaxation oscillator;

the first and second control signals are generated based on the FC signal and a feedback signal from the relaxation oscillator;

the first control signal is different from the second control signal; and the frequency of the oscillating output signal is controlled based on the first and second control signals, wherein:

the relaxation oscillator comprises a first oscillator sub-circuit, a second oscillator sub-circuit, and a latch;

the first oscillator sub-circuit receives the first control signal for controlling a first sub-circuit output signal provided by the first oscillator sub-circuit to the latch;

the second oscillator sub-circuit receives the second control signal for controlling a second sub-circuit output signal provided by the second oscillator sub-circuit to the latch; and the latch generates the oscillating output signal and the feedback signal.

3. The system of claim 2, wherein:

following a change in the frequency control signal, the FC unit changes the first control signal at a first change time, and changes the second control signal at a second change time different from the first time;

each of the first and second oscillator sub-circuits may be in an idle state or a non-idle state;

the first change time is selected to occur while the first oscillator sub-circuit is in the idle state; and the second change time is selected to occur while the second oscillator sub-circuit is in the idle state.

4. The system of claim 3, wherein the first and second change times are selected based on the feedback signal.

5. The system of claim 3, wherein:

the feedback signal comprises upticks and downticks;

the first change time is triggered by one of an uptick and a downtick of the feedback signal; and the second change time is triggered by the other of the uptick and the downtick of the feedback signal.

6. The system of claim 2, wherein:

each of the first and second oscillator sub-circuits comprises a current source, a transistor, a capacitor, and a comparator;

the transistor has source, drain, and gate terminals;

the capacitor has first and second terminals;

the comparator has positive and negative inputs and an output;

the current source provides current to a node connected to the drain terminal of the transistor, the first terminal of the capacitor, and the positive terminal of the comparator;

the negative terminal of the comparator is connected to a reference voltage; and the source terminal of the transistor is connected to the second terminal of the capacitor.

7. The system of claim 6, wherein:

each capacitor is a programmable capacitor having a variable capacitance; and the first and second control signals control the capacitance of the programmable capacitors of the first and second oscillator sub-circuits, respectively.

8. The system of claim 6, wherein:

each current source is a programmable current source having a variable output current level; and the first and second control signals control the output current level provided by the programmable current sources of the first and second oscillator sub-circuits, respectively.

9. The system of claim 6, wherein:

each reference voltage is from a programmable reference source having a variable voltage level; and the first and second control signals control the programmable reference sources of the first and second oscillator sub-circuits, respectively.

10. The system of claim 6, wherein:

the latch is a set/reset latch having a set input, a reset input, a Q output, and a complementary QB output;

the output of the comparator of the first oscillator sub-circuit is the first sub-circuit output signal connected to the reset input of the latch;

the output of the comparator of the second oscillator sub-circuit is the second sub-circuit output signal connected to the set input of the latch;

the complementary QB output of the latch is connected to the gate terminal of the transistor of the first oscillator sub-circuit;

the Q output of the latch is connected to the gate terminal of the transistor of the second oscillator sub-circuit; and the Q output of the latch provides the feedback signal.

11. The system of claim 1, wherein:

data on the first control signal, the second control signal, and the frequency control signal represent n-bit binary numbers for setting the frequency of the oscillator output signal.

12. The system of claim 11, wherein:

the FC unit comprises n data-processing sub-circuits, each for processing a corresponding bit of the frequency control signal;

each data-processing sub-circuit comprises first and second propagation circuits;

each propagation circuit comprises a D flip-flop, a clock-gating cell, and a comparator;

the D flop-flop has a D input, a clock input, and a Q output;

the clock-gating cell has an enable input, a clock input, and a gated-clock output;

the comparator compares the corresponding bit of the frequency control signal to the Q output of the D flip-flop and outputs a result to the enable input of the clock-gating cell;

the result of the comparator (i) enables the clock-gating cell if the corresponding bit of the frequency control signal and the Q output of the D flip-flop are different and (ii) disables the clock-gating cell if the corresponding bit of the frequency control signal and the Q output of the D flip-flop are the same;

the D input of the D flip-flop receives the corresponding bit of the frequency control signal;

the clock input of the clock-gating cell receives the feedback signal; and the clock input of the D flip-flop receives the gated-clock output of the clock-gating cell.

13. The system of claim 12, wherein:

the clock input of the clock-gating cell of the first propagation circuit is positive-edge triggered;

the clock input of the D flip-flop of the first propagation circuit is negative-edge triggered;

the clock input of the clock-gating cell of the second propagation circuit is negative-edge triggered; and the clock input of the D flip-flop of the second propagation circuit is positive-edge triggered.

14. The system of claim 12, wherein the comparator comprises a XOR gate.

15. The system of claim 12, wherein:
the Q output of the D flip-flop of the first propagation circuit is a corresponding bit of the first control signal; and
the Q output of the D flip-flop of the second propagation circuit is a corresponding bit of the second control signal.

16. A relaxation oscillator system for generating an oscillating output signal based on a frequency control (FC) signal, the system comprising:
a relaxation oscillator configured to generate the oscillating output signal; and
a frequency control (FC) unit that controls the frequency of the oscillating output signal generated by the relaxation oscillator, wherein:
the FC unit generates at least first and second control signals for provision to the relaxation oscillator;
the first and second control signals are generated based on the FC signal and a feedback signal from the relaxation oscillator;
the first control signal is different from the second control signal; and
the frequency of the oscillating output signal is controlled based on the first and second control signals,
wherein:
data on the first control signal and the second control signal represent n-bit binary numbers for setting the frequency of the first latch output signal;
data on the frequency control signal represents an m-bit binary number for setting the frequency of the first latch output signal; and
n is different from m.

* * * * *